United States Patent

Hogan et al.

[11] Patent Number: 5,866,263
[45] Date of Patent: Feb. 2, 1999

[54] ADSORBENT LID CONSTRUCTION

[75] Inventors: Daniel Mathew Hogan, Centereach; Vincent Scarnecchia, Mohegan Lake, both of N.Y.

[73] Assignee: Semi-Alloys Company, Mt. Vernon, N.Y.

[21] Appl. No.: 638,368

[22] Filed: Apr. 26, 1996

[51] Int. Cl.$^6$ .............................. B32B 15/04; C23C 14/06
[52] U.S. Cl. ..................... 428/457; 428/641; 428/660; 438/121; 438/122; 438/106; 204/192.1; 204/192.15; 204/192.23
[58] Field of Search ..................... 428/457, 641, 428/660; 438/121, 122, 106; 252/194; 204/192.1, 192.14, 192.15, 192.23

[56] References Cited

U.S. PATENT DOCUMENTS

| | | | |
|---|---|---|---|
| 4,427,992 | 1/1984 | Ritchie et al. | 357/78 |
| 4,900,646 | 2/1990 | Senske et al. | 430/64 |
| 5,250,845 | 10/1993 | Runyan | 257/729 |
| 5,401,536 | 3/1995 | Shores | 427/294 |

*Primary Examiner*—Marion McCamish
*Assistant Examiner*—Cheryl Juska
*Attorney, Agent, or Firm*—Gottlieb, Rackman and Reisman, P.C.

[57] ABSTRACT

An absorbent lid or cover for a hermetic enclosure comprises a coating applied via sputtering to at least a portion of at least one surface of the lid and consisting of at least one elemental metal selected from the group consisting of silicon, germanium and titanium. Adsorbent inserts for such enclosures that are either sputter-coated or sputter-shaped with the aforementioned elemental metals are also disclosed, as are methods for making such covers, inserts and enclosures.

7 Claims, No Drawings

ADSORBENT LID CONSTRUCTION

FIELD OF THE INVENTION

This invention relates generally to improvements in hermetic enclosures for use in the electronics industry. In particular, one embodiment of this invention relates to an improved cover or lid for hermetically sealing packages for electronic semiconductor devices, and to methods for making such a lid and such a package. More particularly, that embodiment of this invention relates to a lid that is selectively coated on the seal side with an adsorbent material that can reduce or eliminate harmful residual gases and/or gaseous by-products that are trapped within the package.

BACKGROUND OF THE INVENTION

In the production of hermetic enclosures, such as packages for semiconductor devices, a housing or base member containing a semiconductor die or chip is typically sealed with a lid which is usually attached to the base by means of a peripheral charge of solder, and the package is sealed by assembling the lid adjacent to the base and by subjecting this assemblage to heat in order to melt the solder. For many applications a pre-formed peripheral charge of solder (known as a solder "preform") is pre-attached to the cover during the manufacturing process, so that the lid and solder are provided together, as a combined unit. Such combined hermetic sealing covers for a package for a semiconductor device, a method for their fabrication and a method for fabricating a sealed package with them, are described, for example, in U.S. Pat. Nos. 3,874,549, 3,946,190 and 3,823,468.

Typically, the cover or lid comprises a substrate that is made of plastic or of metal (e.g., iron-nickel or iron-nickel-cobalt alloys such as KOVAR (KOVAR is a registered trademark of CRS Holding, Inc.)), which is sometimes coated with a thin layer of either nickel or gold or with alternating layers of nickel and gold. One conventional technique for applying these coatings to metallic covers is electroplating, and plated metallic covers as well as methods of fabricating and plating such covers are described in U.S. Pat. Nos. 4,243,729, 4,284,481, 4,601,958 and 4,666,796.

For some applications the body of the lid either is constructed entirely of glass, or it is constructed of plastic or metal but with a central opening adapted to accept a glass insert, in either case thereby allowing electromagnetic radiation such as light to reach the electronic device even after the package is sealed. Many of the physical characteristics of the cover, such as the size, shape, composition, configuration and thickness of the lid itself, as well as the composition and thickness of the coating layers (if any), and the size, shape, composition and thickness of the glass insert (if any), are typically specified within narrow tolerances by the manufacturer of the electronic device that is intended to be housed within the package.

During the process of sealing a semiconductor package, residual atmospheric gases can sometimes remain inside the package, due to incomplete evacuation. Also, after the package is sealed and the electronic device within the assembled package is placed into use, the normal operation of the electronic device often generates harmful gases and/or moisture which also become trapped inside the package. Although the prior art has attempted to deal with the problem of excess moisture trapped within the package, by suggesting the inclusion of powder or granular dessicant materials within the package, or by teaching the formation of gels or pastes comprising dispersions of such dessicant materials and the subsequent application thereof to the interior of the package, the prior art has not addressed the reduction or elimination of common but deleterious atmospheric gases, such as oxygen, carbon monoxide, carbon dioxide and ammonia, as well as nitrates and sulfates, from the interior or cavity of the package.

It is generally well known that certain elemental metals, specifically, silicon, germanium and titanium, can provide strong adsorption sites for water, water vapor and common atmospheric gases. However, in general, highly pure layers of these materials cannot be electroplated onto the outer surface of a typical coated hermetic sealing cover for a semiconductor package. Moreover, these three elemental metals differ somewhat from one another in the nature and extent of their chemical and physical adsorption properties, and they also differ from one another with respect to the layer thickness and grain size at which their adsorbent properties can be optimized. However, none of the techniques (e.g., stencil printing) suggested by the prior art for applying a moisture-adsorbent material to the interior of a semiconductor package allows sufficient control over either the thickness or the grain size of the material being applied to enable the effective use of any of these more efficient, adsorbent elemental metals in a semiconductor package.

It is therefore the principal object of this invention to provide a sealing cover or an insert for a semiconductor package, methods for making such a cover and/or insert and methods for making such a package, in which a material that is capable of adsorbing both moisture and other common atmospheric gases is selectively coated on the sealed side of the cover or on the insert utilizing a technique which allows precise control of the thickness and grain size of the adsorbent material being applied, and thus allowing those parameters to be adjusted depending upon the specific nature of the adsorbent material being used and the other requirements of the manufacturer of the electronic device.

SUMMARY OF THE INVENTION

In accordance with one embodiment of the invention, the method of manufacturing this type of hermetic sealing cover comprises applying selectively, to only one surface of the cover (i.e., to the surface that will ultimately face the interior of the package), a layer of at least one of these known adsorbent elemental metals, thereby providing a lid that, when used to seal the package, will automatically reduce or eliminate the harmful residual gases and/or gaseous by-products mentioned above. The adsorbent elemental metal is preferably applied selectively, i.e., on only the seal surface of the lid, and not at the peripheral edges of that surface, where it might interfere with the wetting of the solder. A physical vapor deposition technique known as "sputtering" is used to apply the adsorbent material to the lid, since it is thereby possible to control closely both the grain size and the layer thickness of that material, thus allowing optimization of its adsorbent activity.

In other embodiments of the invention, a layer of at least one of the adsorbent elemental metals may be applied, also via sputtering, either to known inserts for hermetic enclosures which function as heat sinks, or to specially-created inserts for such packages having no other function except the adsorption of harmful residual gases and/or gaseous by-products. Alternatively, the sputtering process itself may be used to fabricate specialized inserts having these adsorbent properties.

The foregoing object, as well as other objects, features and advantages, of the present invention will become more apparent from the detailed description of the preferred embodiments thereof.

DESCRIPTION OF THE PREFERRED EMBODIMENTS

According to the invention, an adsorbent material is applied to a sealing lid or to an insert for a hermetic enclosure. The adsorbent material may be selected from among, and may comprise one or more of, the following elemental metals: silicon, germanium or titanium. Each of these materials is utilized in bulk form, with the purity of the metal preferably being 99.9% or better, and each is preferably obtained in a form that is usable directly in the sputtering process. Elemental silicon, germanium or titanium, that is suitable for use with the present invention and which is pre-configured as a sputtering target, can be obtained from any of a variety of known sources, including Cerac Incorporated of Milwaukee, Wis., and Balzers Limited, headquartered in Zurich, Switzerland.

Among the foregoing materials, the use of silicon alone is preferred, primarily because it has the most versatile adsorbent properties, and also because it is the easiest with which to work. Silicon provides a strong adsorption site for common atmospheric gases, in particular oxygen (with which it bonds to form a natural oxide), water, ammonia and carbon monoxide and dioxide, as well as certain nitrates and sulfates. In general, most gases that have an available oxygen or hydroxyl (OH) site will be adsorbed onto silicon surfaces. Even more affinity to the silicon surface is exhibited by compounds that have fluorine endgroups capable of reacting with the silicon. In general, once reacted these species are very difficult to remove. Nitrogen physisorbs onto the silicon surface but is readily removed or displayed by other species. Species with poor affinity to the silicon surface are compounds such as hydrocarbons, amines and amides, where poor bonding to the silicon (oxide) surface occurs (although some of the azole compounds, i.e., 5-membered ring compounds with nitrogen groups, do chemisorb to the silicon surface).

Compounds that have hydroxyl groups that will adsorb on the silicon surface include such materials as water, alcohols, esters, ethers, lactones, etc., and these include many of the harmful products which outgas from the epoxy materials that are typically used in semiconductor packages. The affinity of ammonia, as well as certain nitrates and sulfates, for silicon will also be of benefit since these species are also present in outgassing products from some epoxy systems as they cure. Fluorocarbon breakdown products, especially those which eventually form airborne hydrofluoric acid, will be adsorbed rapidly onto silicon surfaces and will tenaciously adhere.

With the exception of the fluorine-bearing adsorbed species, most of the chemisorbed gases on silicon surfaces will begin to desorb at operating temperatures between 150° C. and 400° C., with the hydroxyl-attached species being released more quickly than the others. For instance, water will begin to desorb from a silicon surface in the neighborhood of 150° C. while carbon dioxide does not show appreciable desorption until about 300° C. is reached. Depending on the number and strength of the chemisorption bonds, the nitrogen and sulfur groups begin to desorb after about 350° C. As stated above, the fluorine groups are difficult to remove and are generally not desorbed until the temperature has exceeded 500° C. where interaction with the gases in the environment occurs.

The silicon surface can be made even more active by reducing the natural surface oxide to the suboxide or metallic state. This can be accomplished by exposing the naturally oxidized surface to a hydrogen environment (such as forming hydrogen gas) at elevated temperature. After reduction, the surface will also adsorb airborne hydrocarbons as well as the above mentioned species.

Although the use of silicon is preferred, it is nevertheless within the scope of this invention to utilize germanium or titanium instead (both of which have similar but less versatile adsorbent properties, and both of which are somewhat more difficult to control), or combinations thereof or combinations of either or both of these materials with silicon. The adsorbent material(s) will be chosen to meet the specifications of the manufacturer of the electronic device, or the choice will be dictated by the circumstances.

In accordance with the invention, the adsorbent material is applied to the lid utilizing sputtering, which is a well-known physical vapor deposition technique. The history and use of this technique is described in detail in Chapters 3 and 4 of the *Handbook of Thin Film Technology*, edited by Leon I. Maissel and Reinhard Glang, the relevant portions of which are incorporated herein by reference. Sputtering apparatus for use in conjunction with the present invention are widely available commercially, and may be obtained from any of a variety of known sources, including Plasmatron Coating Systems Inc. and Denton Vacuum Inc., both of Moorestown, N.J.

In general, the sputtering technique may be utilized to apply the adsorbent material to lid substrates made of plastic, glass, or metal (e.g., KOVAR). The selective application of the adsorbent material only to a portion of one surface of the lid, so as to avoid interference with the wetting of the solder preform, can be accomplished through conventional masking techniques (e.g., photomasking or the use of metallic shapes to act as masks) that are well known in the art.

The use of sputtering provides a variety of means by which to adjust the degree of adsorption which is to be imparted to the lid (which will also be referred to hereinafter as the substrate). The degree of adsorption can be measured, and it can be expressed as the amount of moisture, in parts per million, adsorbed per area square inch of the adsorbent material, or as the number of molecules, expressed in moles, of gaseous species such as $O_2$, $CO_2$, and OH, adsorbed per area square centimeter of the adsorbent material. The degree of adsorption will vary with the characteristics of the sputtered layer (also referred to hereinafter as a sputtered film) of the adsorbent material, including the nature of the material itself, the thickness of the deposited film of that material, and the grain size (i.e., the morphology) of the deposited material which, in turn, affects the surface texture of that material. Specifically, it has been observed that smaller grain sizes correlate with smoother surface textures, while larger grain sizes correlate with rougher surface textures; it is believed that larger grain sizes produce more voids between the grains, yielding rougher surface textures and thereby more surface area of the deposited material, thus increasing the adsorbent properties of that material. In general, a "rough" surface texture as used herein means that the measured peak-to-valley distance is approximately 7,500 Å or greater, while as used herein a "smooth" surface texture means that the measured peak-to-valley distance is in the range of 2,000 Å–5,000 Å.

The use of sputtering enables close control of the thickness of the film of adsorbent material, and the use of sputtering also allows control of the grain size (and thereby the surface texture) of the film by varying such factors as the temperature of the substrate, the substrate field bias voltage and the gas pressure of the plasma gas, all of which will be described in further detail hereinbelow. Thus, the use of sputtering enables selection of thickness and/or surface texture for greater or lesser degrees of adsorption, as desired.

The thickness of the sputtered film of adsorbent material will greatly influence the adsorptive properties of that film. For example, a film of silicon that is 4–5 microinches thick has been observed to adsorb only 300–600 parts per million of moisture per area square inch of film, whereas a silicon film that is 20 microinches thick has been observed to adsorb about five times as much moisture, i.e., 1,500–3,000 parts per million of moisture per area square inch of the film. For use with the present invention, the thickness of the film can generally range from about ten microinches to about 25 microinches. However, if the adsorbent material is silicon, the optimum and therefore preferred thickness is about 20 microinches, while a thickness of about 25 microinches is preferred for titanium or germanium.

In general, films for use with the present invention can be applied as a single layer of the desired thickness, or as several thinner layers applied successively, each of which is approximately 4–5 microinches thick. However, when the adsorbent material is titanium or germanium the successive application of several thin film layers is preferred in order to achieve the optimum film thickness, while the application of a single, twenty-microinch layer is preferred when the adsorbent material is silicon.

As is well known in the sputtering art, the thickness of the deposited film can be controlled by adjusting either the power that drives the sputtering process (i.e., the wattage applied), or the time of deposition, or both. For example, at a constant power level of one kilowatt, and using an in-line type of sputtering apparatus, a twenty-microinch layer of silicon can be deposited in about 8 minutes, while a twenty-five-microinch layer of germanium or titanium can be applied in about 16 minutes or about 9 minutes, respectively. By increasing the power to a level in the range of approximately 6.0–7.5 kilowatts, the same layer thicknesses of these materials can be achieved in significantly less time, e.g., on the order of a few seconds.

The temperature of the substrate will also influence the adsorptive properties of the deposited film by affecting its morphology, i.e., its roughness. In general, it has been observed that as the temperature of the substrate increases, the roughness of the surface texture of the film, and therefore its adsorptive properties, also increase, until an optimum temperature range is reached. For example, when the substrate temperature is held to about 80° C., which for a metallic substrate is the minimum temperature at which sputtering normally begins, a silicon film that is about 20 microinches thick will adsorb 1,500–3,000 parts per million of moisture per area square inch of the film, as mentioned hereinabove. If the substrate temperature is maintained at about 100° C., however, the adsorption improves by about 800 parts per million of moisture per area square inch of the film, and if the temperature of the substrate is allowed to rise to, and is thereafter maintained at, approximately 200° C., the adsorption of the deposited film will increase to about 4,000–5,000 parts per million of moisture per area square inch of the film.

As is well known in the sputtering art, if the temperature of the substrate is maintained at approximately room temperature, the deposited film will exhibit a porous structure consisting of tapered crystallites, separated by voids, resulting in a high ratio of surface area to film volume. However, if the substrate temperature is maintained in a range of from about 10% to about 30% of the melting temperature of the adsorbent material being deposited (with all temperatures being expressed in degrees Celsius), the film will exhibit a structure comprising densely packed fibrous grains. If the substrate temperature is maintained in a range of from about 30% to about 50% of the melting temperature of the adsorbent material, the deposited film will exhibit a structure comprising columnar grains, due to the onset of granular epitaxy. If the temperature of the substrate is maintained above this range, the deposited film will exhibit extensive grain growth with a recrystallized grain structure.

In general, the adsorptive properties of a silicon film are optimized if the film has the structure that is produced when the substrate temperature is maintained in the range of from about 10% to about 30% of the melting temperature of silicon. If the adsorbent material is germanium, generally the adsorptive properties of the film are optimized if the film has the structure that is produced when the substrate temperature is maintained in the range of from about 25% to about 35% of the melting temperature of germanium. In general, the adsorptive properties of a titanium film are optimized if the film has the structure that is produced when the substrate temperature is maintained in the range of from about 30% to about 50% of the melting temperature of titanium. It has been observed that for a box-coater type of sputtering apparatus, a substrate temperature of approximately 200° C. will produce a film structure or morphology that yields acceptable adsorptive properties of the film for any one of the three adsorbent elemental metals that may be used in accordance with this invention.

As is well known in the sputtering art, the temperature of the substrate can be controlled either by adjusting the power that drives the sputtering process (i.e., the wattage applied), or by circulating a cooling fluid (e.g., water) around the sputtering chamber, or by adjusting the "time of flight" of the material being sputtered by changing the physical distance between the sputtering cathode and the substrate (for a box-coater sputtering apparatus, the optimum distance is about 10 inches, while for an inline sputtering apparatus, the optimum distance is about one inch). In general, the preferred method of controlling the temperature of the substrate is by adjusting the wattage.

The variation of film morphology as a function of the substrate temperature, as described hereinabove, can be altered by increasing the pressure of the plasma gas during the sputtering process. In general, a noble gas such as neon, argon or krypton, is used as the sputtering gas during physical vapor deposition. By increasing the pressure of that gas, the changes in film structure noted above will occur at higher substrate temperatures than when normal gas pressure is used. Thus, changes in the gas pressure can be used to affect film morphology, assuming that the substrate temperature and other variables are held constant.

For example, as is well known in the sputtering art, a sputtering gas pressure of about $1 \times 10^{-4}$ torr is normally used. If this pressure is increased to about $6 \times 10^{-4}$ torr, then at any given substrate temperature the sputtering process will yield a film with a larger grain size, i.e., a rougher surface texture, thereby increasing the adsorptive properties of the film by an additional 600–650 parts per million of moisture per area square inch of the film, as compared with a film produced under the same conditions but at normal gas pressure.

Similarly, the variation of film morphology as a function of temperature, as described hereinabove, can also be affected by applying a field bias voltage to the substrate during the sputtering process. The application of a field bias permits the use of lower substrate temperatures, since the changes in morphology with temperature noted hereinabove will occur at lower temperatures than would otherwise be the case if no bias were applied. Thus, the application of a field bias can also be used to alter film morphology, assuming that the substrate temperature and other variables are held constant.

For example, for metallic substrates, the application of a negative bias voltage in the range of negative 5–7 volts will yield, at any given substrate temperature, a sputtered film with a larger grain size, i.e., a rougher surface texture, thereby increasing the adsorptive properties of the film by an additional 1,000–2,000 parts per million of moisture per area square inch of the film, as compared with a film produced under the same conditions but with no bias applied. For non-metallic substrates (e.g., plastic), the same effect can be achieved by applying R.F. power in the range of 4–5 volts, since as is well known, a negative bias voltage will have no effect upon non-metallic materials in a sputtering environment.

It has been observed that when the degree of adsorption is expressed as the number of moles of gaseous molecules adsorbed per area square centimeter of the adsorbent material, a smooth twenty-microinch layer of silicon produced in accordance with the invention will adsorb about 3.6 micromoles, while a more rough layer of silicon of the same thickness (which has been made more rough by optimizing the substrate temperature and by adjusting the sputtering gas pressure) will adsorb about 3.9 micromoles. Similarly, a smooth twenty-five-microinch layer of germanium will adsorb 1.4 micromoles, while a rough layer of germanium of the same thickness will adsorb about 1.9 micromoles. In a similar fashion, a smooth twenty-five-microinch layer of titanium will adsorb about 2.1 micromoles, while a rough layer of titanium of the same thickness will adsorb about 2.6 micromoles.

Although the invention has been described hereinabove with reference to one particular preferred embodiment thereof, namely, the application via sputtering of a layer or film of an adsorbent elemental metal to a sealing lid for a hermetic enclosure, the principles of the invention may be extended so as to produce other preferred embodiments thereof. For example, instead of applying a layer or film of the adsorbent material to the lid of the enclosure, it may instead be sputtered onto at least one surface of a form that is shaped to fit within and adapted to be inserted into the enclosure, e.g., in a specific area, or onto a form that is adapted to be attached to a circuit board (the latter may or may not have semiconductor chips assembled thereon). Such forms may be pre-stamped from appropriate substrate materials and machined, and then a layer or film of one or more of the adsorbent elemental metals may be applied via sputtering as described hereinabove, or alternatively such forms may be "sputter shaped" directly from (and thus be comprised solely of) one or more of the adsorbent elemental metals themselves. In addition, or in the alternative, heat sink forms which are commonly fabricated to control temperatures within hermetic enclosures may also be provided with a layer or film of one or more of the adsorbent elemental metals, applied via sputtering as described hereinabove, before they are placed within such an enclosure.

While there has been described what is at present considered to be the preferred embodiments of the present invention, it will be obvious to those skilled in the art that various changes and modifications may be made therein, without departing from the invention, and it is, therefore, aimed in the appended claims to cover all such changes and modifications as fall within the true spirit and scope of the invention.

We claim:

1. A sealing cover for a hermetic enclosure comprising a sputtered coating applied to at least a portion of at least one surface of said cover, said coating comprising at least one elemental metal selected from the group consisting of silicon, germanium and titanium.

2. The cover of claim 1 wherein said cover is heat sealable to said enclosure.

3. The cover of claim 2 wherein said at least one metal is silicon.

4. An insert for a hermetic enclosure comprising a form adapted to fit within said enclosure and a sputtered coating applied to at least a portion of said form, said coating comprising at least one elemental metal selected from the group consisting of silicon, germanium and titanium.

5. The insert of claim 4 wherein at least a portion of said form also comprises a heat sink for said device.

6. An insert for a hermetic enclosure comprising a form adapted to fit within said enclosure and consisting of at least one elemental metal selected from the group consisting of silicon, germanium and titanium, said form having been created from said at least one elemental metal via sputtering.

7. The insert of claims 4, 5, or 6 wherein said at least one metal is silicon.

* * * * *